(12) United States Patent
Ohno et al.

(10) Patent No.: US 8,263,999 B2
(45) Date of Patent: Sep. 11, 2012

(54) NITRIDE SEMICONDUCTOR LIGHT-EMITTING DEVICE

(75) Inventors: Akihito Ohno, Tokyo (JP); Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1091 days.

(21) Appl. No.: 11/936,846

(22) Filed: Nov. 8, 2007

(65) Prior Publication Data

US 2008/0251804 A1   Oct. 16, 2008

(30) Foreign Application Priority Data

Apr. 16, 2007   (JP) .................................. 2007-107310

(51) Int. Cl.
*H01L 33/001* (2006.01)
(52) U.S. Cl. ...... 257/103; 257/94; 257/99; 257/E33.056
(58) Field of Classification Search .................... 257/94, 257/99, 103, E33.056
See application file for complete search history.

(56) References Cited

U.S. PATENT DOCUMENTS

| | | | |
|---|---|---|---|
| 5,753,939 A | 5/1998 | Sassa et al. | |
| 6,649,942 B2 | 11/2003 | Hata et al. | |
| 6,977,953 B2 | 12/2005 | Hata et al. | |
| 2002/0003234 A1 | 1/2002 | Hayashi et al. | |
| 2002/0190263 A1* | 12/2002 | Hata et al. | 257/103 |
| 2005/0145860 A1* | 7/2005 | Tanizawa | 257/85 |
| 2008/0048194 A1 | 2/2008 | Kudo et al. | |

FOREIGN PATENT DOCUMENTS

| | | |
|---|---|---|
| JP | 08-097471 | 4/1996 |
| JP | 10-51030 | 2/1998 |
| JP | 2000-164922 | 6/2000 |
| JP | 2000-307149 | 11/2000 |
| JP | 2002-94190 A | 3/2002 |
| JP | 2003-46127 A | 2/2003 |
| JP | 2003-60319 A | 2/2003 |
| JP | 2003-347658 A | 12/2003 |
| JP | 2007-96171 A | 4/2007 |
| WO | WO 2005/122290 A1 | 12/2005 |

OTHER PUBLICATIONS

English language translation of Taiwanese Patent Office; Notice of Examination Opinion in Taiwanese Patent Application No. 10020668440 (Jul. 28, 2011).
Japanese Patent Office, Office Action in Japanese Patent Application 2007-107310 (Jul. 17, 2012).

* cited by examiner

*Primary Examiner* — Cuong Q Nguyen
*Assistant Examiner* — Tran Tran
(74) *Attorney, Agent, or Firm* — Leydig, Voit & Mayer, Ltd.

(57) ABSTRACT

A nitride semiconductor light-emitting device includes a p-type contact layer, a p-type intermediate layer below the p-type contact layer, and a p-type cladding layer below the p-type intermediate layer. Band gap energy differences between the p-type contact layer and the p-type intermediate layer and also between the p-type intermediate layer and the p-type cladding layer are, respectively, 200 meV or below.

6 Claims, 3 Drawing Sheets

| Name of layer | Composition | Dopant | Dopant density | Band gap |
|---|---|---|---|---|
| P-type contact layer 28 | GaN (Al=0) | Mg | $1E20 cm^{-3}$ | 3.39 [eV] |
| P-type intermediate layer 26 | $Al_{0.03}Ga_{0.97}N$ (Al=0.03) | Mg | $5E18 cm^{-3}$ | 3.46 [eV] |
| P-type clad layer 24 | $Al_{0.07}Ga_{0.93}N$ (Al=0.07) | Mg | $2E19 cm^{-3}$ | 3.55 [eV] |

| Name of layer | Composition | Dopant | Dopant density | Band gap |
|---|---|---|---|---|
| P-type contact layer 28 | GaN | Mg | $1E20 cm^{-3}$ | $3.39 [eV]$ |
| P-type intermediate layer 40 | GaN | Mg | $5E18 cm^{-3}$ | $3.39 [eV]$ |
| P-type clad layer 24 | $Al_{0.07}Ga_{0.93}N$ | Mg | $2E19 cm^{-3}$ | $3.55 [eV]$ |

NITRIDE SEMICONDUCTOR LIGHT-EMITTING DEVICE

BACKGROUND OF THE INVENTION

1. Field of the Invention

The present invention relates to a nitride semiconductor light emitting device and more particularly, to a nitride semiconductor light emitting device adapted for use at low voltage.

2. Background Art

Nitride semiconductors have been put into practice in a variety of products as a material for light emitting devices and electronic devices. Nitride semiconductor devices disclosed in JP-A-2000-307149 are provided with a high-concentration doped layer and a low-concentration doped layer intermediate between a p-type contact layer and a p-type clad layer. The nitride semiconductor device is so arranged as having such a structure as mentioned above, so that impurity concentrations of the p-type layers are optimized, thereby reducing a working voltage.

[Patent Literature 1] JP-A-2000-307149
[Patent Literature 2] JP-A-2000-164922

For a factor determining a working voltage of a nitride semiconductor device, mention is made of the discontinuous quantity of a band gap at the heterojunction. If the discontinuous quantity of a band gap at the heterojunction at which carriers are to be transported is great, it serves as a barrier in the course of transport of carriers, thus being unfavorable from the standpoint of low working voltage. However, in such conventional nitride semiconductor light emitting device as set out above, no design consideration is given to the band discontinuous quantity, leading to a problem in that a difficulty is involved in realizing a low working voltage while keeping emission output power.

SUMMARY OF THE INVENTION

The invention has been made to provide a nitride semiconductor device wherein a working voltage is suppressed.

According to one aspect of the present invention, a nitride semiconductor light-emitting device includes a p-type contact layer, a p-type intermediate layer formed below the p-type contact layer, and a p-type clad layer formed below the p-type intermediate layer. Band gap differences between the p-type contact layer and the p-type intermediate layer and also between the p-type intermediate layer and the p-type clad layer are, respectively, at 200 meV or below.

Other and further objects, features and advantages of the invention will appear more fully from the following description.

DETAILED DESCRIPTION OF THE PREFERRED EMBODIMENTS

First Embodiment

For the manufacture of a nitride semiconductor light emitting device according to this embodiment, trimethyl gallium (hereinafter abbreviated as TMG), trimethyl aluminum (hereinafter abbreviated as TMA) or trimethyl indium (hereinafter abbreviated as TMI) is used as a III group material. As a V group material, ammonia ($NH_3$) gas is used. For an n-type impurity material, monosilane (hereinafter referred to as $SiH_4$) is used. For a p-type impurity material, cyclopentadienyl magnesium (hereinafter referred to as $CP_2Mg$) is used. For carrier gases of these starting gases, there are used hydrogen ($H_2$) gas and nitrogen ($N_2$) gas. It will be noted that such starting materials as indicated above are shown by way of example and should not be construed as limited thereto.

In general, for the crystal growth of nitride semiconductors, there are frequently used a metal organic chemical vapor deposition (MOCVD) method, a molecular beam epitaxy (MBE) method, and a hydride vapor phase epitaxy (HVPE) method. In this embodiment, the metal organic chemical vapor deposition (MOCVD) method is used as for the crystal growth of a nitride semiconductor. It will be noted that the method of crystal growth for the manufacture of a nitride semiconductor light emitting device of this embodiment is not limited to the metal organic chemical vapor deposition (MOCVD) method, and there may also be used the molecular beam epitaxy (MBE) method and the hydride vapor phase epitaxy method.

Figures 1, 2:
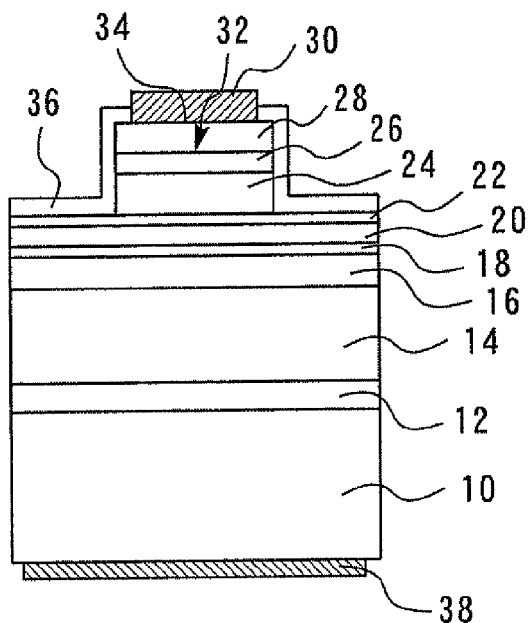
FIG. 1 is a view illustrating an arrangement of a nitride semiconductor light-emitting device of first embodiment.
FIG. 2 is directed to a data arrangement in a table wherein compositions and the like of the p-type clad layer, p-type intermediate layer and p-type contact layer of first embodiment are indicated.

FIG. 1 is a view illustrating an arrangement of a nitride semiconductor light emitting device of the embodiment. A substrate 10 is formed of GaN. In this embodiment, the main surface of the substrate 10 is a (0001) face. This substrate 10 is placed in a MOCVD (metal organic chemical vapor deposition) apparatus. While feeding $NH_3$ gas, the temperature is raised to 1000° C. Thereafter, feed of TMG and $SiO_4$ is started thereby causing an n-type semiconductor layer 12 to be grown. The n-type semiconductor layer 12 is one which is formed on the main surface of the substrate 10 with a thickness of 1 μm and is mainly formed of GaN. Next, feed of TMA is started to have an n-type clad layer 14 grown. The n-type clad layer 14 is a layer formed of n-type aluminum gallium nitride ($Al_{0.07}Ga_{0.93}N$) and having a thickness of 1.0 μm. The n-type clad layer is provided as a layer mainly for enhancing an electron density of an active layer described hereinafter. The feed of TMA is stopped, and a 1.0 μm thick n-type optical guide layer 16 formed of n-type GaN is grown. The n-type optical guide layer 16 is a layer serving mainly to confine light in an active layer described hereinafter and to control an optical density in the active layer. Subsequently, the feed of TMG and $SiH_4$ is stopped and the temperature is lowered to 700° C. As stated hereinabove, those layers including from the n-type semiconductor layer 12 to the n-type guide layer 16 are of the n-type conduction.

Next, there is grown an active layer 18 which is made up of a multiple quantum well (hereinafter referred to as MQW) using indium gallium nitride (InGaN). The active layer 18 has a structure of three pairs of well layers and barrier layers being alternately built up. The well layer is formed by feeding TMI, TMG and ammonia (hereinafter referred to simply as $NH_3$). The composition is made of $In_{0.12}Ga_{0.88}N$. The film thickness is at 3.5 nm. On the other hand, the barrier layer is formed by feeding TMG and $NH_3$. The composition is made of GaN. The film thickness is at 7.0 nm. Since the active layer 18 has such an MQW structure as set out above, high outputting of light emitted from the active layer 18 can be achieved.

Subsequently, the feed of TMG is stopped, after which while feeding $NH_3$, the temperature is raised to 1000° C. The feed of TMG, TMA and CP2MG is started to form a p-type electron barrier layer 20. The p-type electron barrier layer 20 has a composition of $Al_{0.2}Ga_{0.8}N$. The film thickness is at 0.02 μm. Next, the feed of TMA is stopped. Thereafter, a p-type optical guide layer 22 is formed. The p-type optical guide layer 22 is made of GaN with a thickness being at 0.1μ. The p-type optical guide layer 22 serves to mainly control an optical density within the active layer 18. Next, the feed of TMA is started to form a p-type clad layer 24. The p-type clad layer 24 has a composition represented by $Al_{0.07}Ga_{0.93}N$ with its thickness being at 0.4 μm. The p-type clad layer 24 is formed mainly for enhancing a hole density of the active layer 18. Next, a p-type intermediate layer 26 is formed. The p-type intermediate layer 26 has a composition represented by $Al_{0.03}Ga_{0.97}N$ with its thickness being at 0.1 μm. The reason why this layer is formed is to reduce a working voltage of the nitride semiconductor laser of this embodiment, with details being described hereinafter. Thereafter, a p-type contact layer 28 is formed. The p-type contact layer 28 has a composition of GaN, with its thickness being at 0.1 μm. The feed of TMG and $CP_2MG$ is stopped, and the temperature is lowered by cooling to room temperature. It is to be noted that impurities are doped in the respective p-type layers, and the densities of the impurity Mg in the p-type clad layer 24, p-type intermediate layer 26 and p-type contact layer 28 are, respectively, $2E19\ cm^{-3}$, $5E18\ cm^{-3}$, and $1E20\ cm^{-3}$. The p-type layers of this embodiment have such an arrangement as set out above.

After completion of such crystal growth as stated above, a resist is coated entirely over the wafer surface. Next, a resist pattern in a desired form corresponding to the shape of a mesa portion is formed by lithography. This resist pattern is used as a mask in such a way that portions not covered with the resist are etched to a depth of the p-type clad layer 24. For the etching, a reactive ion etching (RIE) technique is used, for example. For RIE, chlorine gas is used, for example. In this way, a ridge 32 for forming an optical waveguide structure is formed by etching. While leaving the resist as a mask for the etching, a $SiO_2$ film 36 is formed entirely over the substrate surface in a thickness of 0.2 μm. For the formation of the $SiO_2$ film 36, there is used a CVD (chemical vapor deposition) method, a vacuum deposition method, a sputtering method or the like. Next, the $SiO_2$ film on the ridge is removed along with resist removal. This is a processing called liftoff. As a result of the liftoff, an opening 34 is formed in ridge 32.

Next, a Pt layer and an Au layer are successively formed entirely over the substrate surface. For the formation of the Pt layer and Au layer, a vacuum deposition method is used, for example. Subsequently, resist coating, lithography and etching are carried out. Wet etching or dry etching is used for this etching. In this manner, a p-type electrode 30 is formed in pattern. Next, Ti, Pt and Au films are, respectively, formed entirely over the back surface of the substrate by a vacuum deposition method in order that alloying treatment for ohmic contact of the n-electrode 38 is carried out.

Next, the substrate fabricated in this manner is shaped into a bar such as by cleavage to form opposite resonator end faces. Moreover, end face coating is performed on these resonator end faces. The end face coating is carried out for the purpose of lowering a threshold current density of a laser device. Next, the bar-shaped body is shaped into a chip such as by cleavage. The nitride semiconductor light emitting device of this embodiment is so constructed as stated hereinabove.

FIG. 2 is directed to a data arrangement in a table wherein compositions and the like of the p-type clad layer 24, p-type intermediate layer 26 and p-type contact layer 28 are indicated. The features of the invention reside in configurations of these three layers. Three features of the invention are illustrated successively.

As indicated in FIG. 2, a first feature resides in that a band gap difference between the p-type clad layer 24 and the p-type intermediate layer 26 (hereinafter referred to as first band gap difference) and a band gap difference between the p-type intermediate layer 26 and the p-type contact layer 28 (hereinafter referred to as second band gap difference) are suppressed at 70 meV and 90 meV, respectively. In nitride semiconductor light emitting devices, it becomes necessary to reduce a working voltage while keeping an emission output from the standpoint of a demand for energy saving and the like. One of factors determining a working voltage is an interlayer band discontinuous quantity, i.e., a band gap difference. If a band gap difference is great, it is necessary to make a working voltage high so as to obtain a desired emission output. Thus, a difficulty is involved in realizing a low working voltage. In general, the band gap Eg (eV) of a mixed crystal of $Al_xGa_{1-x}N$ ($0 \leq x \leq 1$) is expressed by the following equation 1

$$Eg[eV] = (1-X) \times (E_{GaN}) + X \times (E_{AlN}) - b \times X(1-X) \quad \text{Equation 1}$$

wherein $E_{GaN}$=band gap of GaN=3.39 eV, $E_{AlN}$=band gap of AlN=6.2 eV, and b (bowing parameter)=0.6.

In the nitride semiconductor light emitting device of the embodiment, the compositions of the p-type clad layer 24 and the p-type intermediate layer 26 are determined based on the above equation 1 and the theory set out hereinafter in order to suppress the first band gap difference and the second band gap difference. The compositions of the p-type clad layer 24 and the p-type intermediate layer 26 are individually determined, so that parameter X used for the p-type clad layer 24 and parameter X used for the p-type intermediate layer 26 are not in coincidence with each other.

Preferable values of the first and second band gap differences are determined based on the following theoretical consideration.

In general, when two types of semiconductors having different band gaps are in conjunction with each other, a band gap difference between the conduction band Ec and the valence electron band Ev occurs at the interface thereof. The band gap difference is determined by the electron affinity of the semiconductors, or is determined such that an energy difference from the vacuum level to the lower end of a conduction band is stored. With GaN (Eg=3.39 eV) and AlN (Eg=6.2 eV), the energy difference between the conduction bands of both (hereinafter referred to as ΔEc) is at about 1.96 eV, and the energy difference between the valence electron bands (hereinafter referred to as ΔEv) is at about 0.84 eV. In order to prevent the working voltage from rising, it is desirable to make the value of ΔEv low. With the case of such GaN and AlN as set out above, if the sum of ΔEv and ΔEc is taken as a band gap difference, the value is about 2.81 eV. Accordingly, ΔEv occupies about 30% of the band gap difference.

The p-type clad layer 24, p-type intermediate layer 26 and p-type contact layer 28 of this embodiment, respectively, have such compositions as indicated in FIG. 2, and the first and second band gap differences are, respectively, at 70 meV and 90 meV. About 30% of the first band gap difference of 70 meV relies on the ΔEv component of the first band gap difference (hereinafter referred to as ΔEv1). ΔEv1 is at about 21 meV. On the other hand, about 30% of the second band gap difference of 90 meV is based on the ΔEv component of the second band gap difference (hereinafter referred to as ΔEv2). ΔEv2 is at about 27 meV. Both ΔEv1 and ΔEv2 are, respectively, substantially at the same level as a thermal energy (about 26 meV) at room temperature. Accordingly, holes that are a p-type carrier are able to cross the barriers of ΔEv1 and ΔEv2 with ease. Hence, ΔEv1 and ΔEv2 do not substantially act to increase a working voltage. In other words, it is preferred that the first and second band gap differences are both at not higher than 100 meV.

Furthermore, assuming that the band gap difference is 200 meV, ΔEv is about at 60 meV. ΔEv as great as 60 meV is approximately double the afore-indicated thermal energy at room temperature, so that an influence of increasing the working voltage is slight. In this sense, a band gap difference of 200 meV is considered to be within a practically allowable range. In this connection, however, where the band gap difference exceeds 300 meV, ΔEv exceeds 90 meV, so that an influence of increasing a working voltage cannot be negligible.

According to such a theoretical consideration as set out above, favorable values for used as the values of the first and second band gap differences are determined. In accordance with the above consideration, it is preferred that the first band gap difference and the second and gap difference are, respectively, at 200 meV or below, more preferably at 100 meV or below. Since the first and second band gap differences of this embodiment are, respectively, at 70 meV and 90 meV, which satisfy the above requirement. Thus, when the first and second gap band differences are suppressed low, the barrier of a carrier can be reduced, thereby enabling a working voltage to be reduced while keeping an emission output.

Preferably, the band gap of the p-type intermediate layer 26 is smaller than the band gap of the p-type clad layer 24. If the band gap of the p-type intermediate layer 26 is small, the activation energy of the Mg used as a dopant of the p-type intermediate layer 26 can be reduced. This permits the p-type intermediate layer 26 to obtain a high carrier concentration. Accordingly, a great quantity of carriers can be supplied to the p-type contact layer 28 formed, as an upper layer, on the p-type intermediate layer 26, so that a working voltage can be reduced while keeping an output of the nitride semiconductor light emitting device. As stated hereinbefore, when the band gap of the p-type intermediate layer 26 is made smaller than the band gap of the p-type clad layer 24, such an effect of reducing a working voltage as set out above can be achieved.

In general, a p-type nitride semiconductor containing Al becomes smaller in band gap energy when an Al content is smaller, with a smaller acceptor level of Mg. For this reason, the Al compositional ratio in the p-type intermediate layer 26 is made lower than an Al compositional ratio in the p-type clad layer 24 in the embodiment as shown in FIG. 2. This leads to the fact that the band gap of the p-type intermediate layer 26 can be made lower than the band gap of the p-type clad layer 24, thereby ensuring a reduced working voltage.

Figure 3:
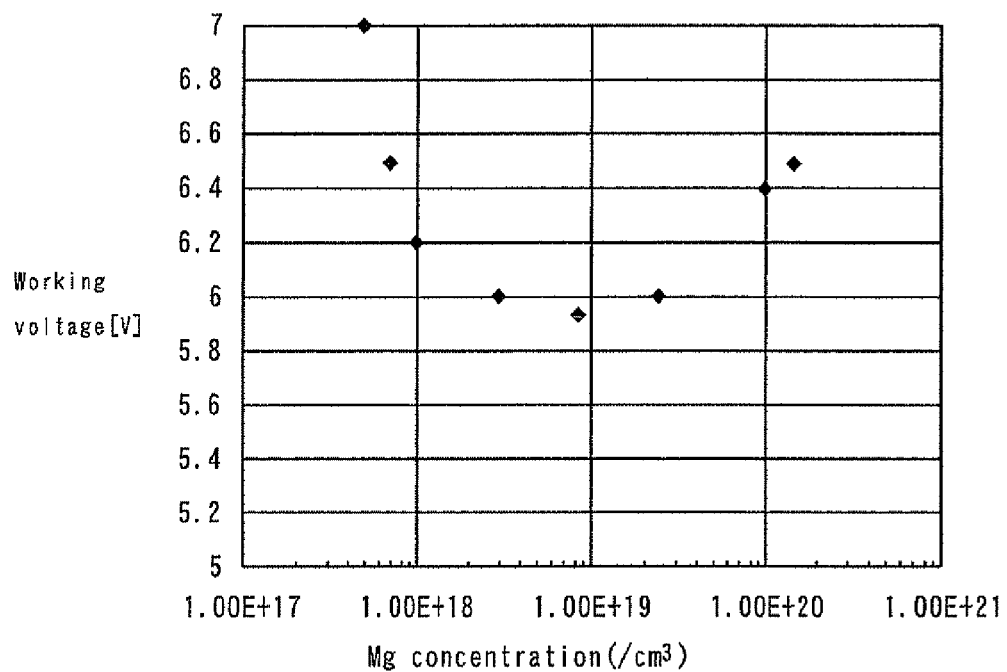
FIG. 3 shows a graph illustrating the relationship between the dopant concentration in the p-type intermediate layer of the nitride semiconductor light-emitting device according to first embodiment and the working voltage thereof.

The second feature resides in that the dopant concentration in the p-type intermediate layer 26 is optimized from the standpoint of working voltage and differential efficiency. This feature is illustrated with reference to FIGS. 3 and 4. In FIG. 3, there is shown a graph illustrating the relationship between the dopant concentration in the p-type intermediate layer 26 of the nitride semiconductor light-emitting device according to the embodiment and the working voltage thereof. The abscissa of the graph in FIG. 3 indicates a Mg concentration in the p-type intermediate layer and the ordinate indicated a working voltage when the nitride semiconductor light emitting device is operated at 100 mA in this embodiment. From FIG. 3, it will be seen that the Mg concentration in the p-type intermediate layer 26 bringing about a minimum working voltage is within a range of 3E18 [$cm^{-3}$] to 3E19 [$cm^{-3}$]. If the Mg concentration is within this range, a minimum working voltage of about 6V can be obtained. The variation in working voltage of the nitride semiconductor light emitting device depending on the Mg concentration in the p-type intermediate layer 26 can be illustrated in terms of the carrier concentration in the p-type intermediate layer 26. More particularly, the carrier concentration in the p-type intermediate layer 26 becomes maximum at a Mg concentration of about 3E18 [$cm^{-3}$] to 3E19 [$cm^{-3}$]. A high carrier concentration leads to an improved hole injection efficiency to the p-type contact layer. Thus, the suppression of working voltage is enabled.

Figure 4:
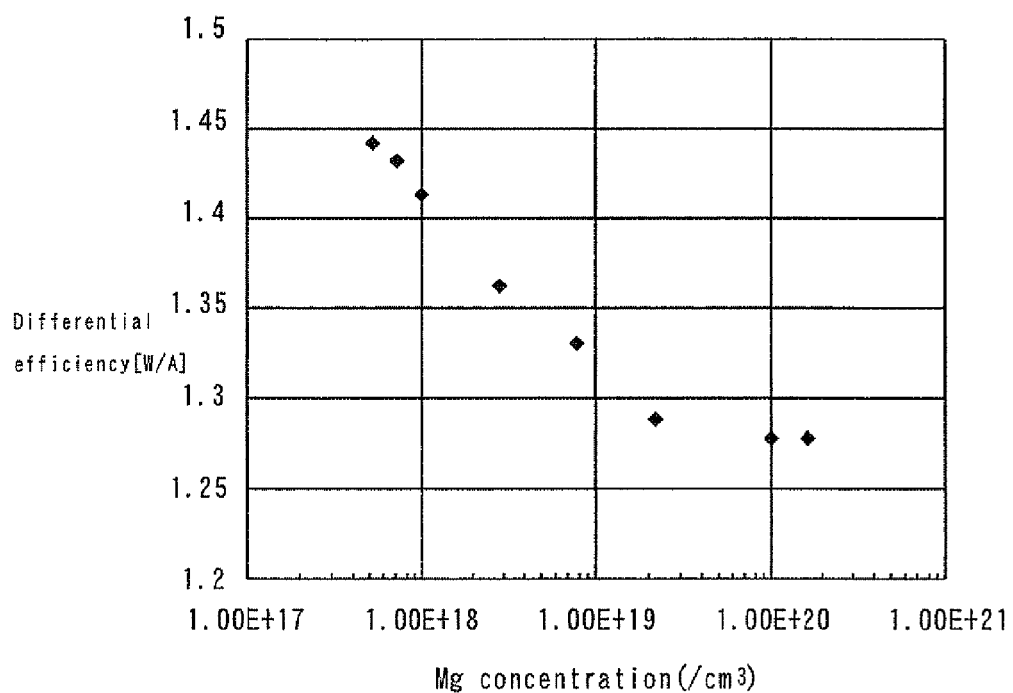
FIG. 4 is a graph showing the relationship between the dopant concentration in the p-type intermediate layer and the differential efficiency of first embodiment.

FIG. 4 is a graph showing the relationship between the dopant concentration in the p-type intermediate layer 26 and the differential efficiency. The abscissa of the graph in FIG. 4 indicates a Mg concentration in the p-type intermediate layer 26 and the ordinate indicates a differential efficiency in the course of oscillation of the nitride semiconductor light emitting device according to the embodiment. In the range where the Mg concentration in the p-type intermediate layer 26 is at 1E19 [$cm^{-3}$] or below, Mg absorbs light, so that a lower Mg concentration leads to a higher differential efficiency. On the other hand, where the Mg concentration is at 2E19 [$cm^{-3}$] or more, the differential efficiency is saturated at 1.28 W/A. Accordingly, in order to improve the differential efficiency, it is preferred that the Mg concentration in the p-type intermediate layer should be not higher than 1E19 [$cm^{-3}$] and should be as low as possible. However, when the Mg concentration is lowered so as to increase the differential efficiency, the working voltage illustrated with reference to FIG. 3 increases. Since the working voltage abruptly increases at a Mg concentration being lower than 1E18 [$cm^{-3}$], it is preferred to dope Mg at not lower than the value indicated above. As will be apparent from the above, the Mg concentration in the p-type intermediate layer 26 which ensures good values with respect to both working voltage and differential efficiency ranges from 1E18 [$cm^{-3}$] to 1E19 [$cm^{-3}$]. The Mg concentration in the p-type intermediate layer 26 of this embodiment is set at 5E18 [$cm^{-31}$], ensuring a low working voltage and a high differential efficiency.

The third feature resides in that the dopant concentration in the p-type intermediate layer 26 is lower than those in the p-type contact layer 28 and the p-type clad layer 24. As stated hereinbefore, the absorption loss caused by absorption of light with Mg in the p-type intermediate layer 26 is a factor of worsening the differential efficiency. In this embodiment, the Mg concentration in the p-type intermediate layer 26 is minimized among the p-type contact layer 28, the p-type intermediate layer 26, and the p-type clad layer 24 to suppress absorption of light ascribed to Mg.

According to the arrangement of the invention having such three features as set out above, the working voltage can be reduced while keeping an emission output.

Although the p-type contact layer 28 has a composition of GaN in this embodiment, the invention is not limited to this composition. More particularly, the effects of the invention can be achieved so far as the composition of the p-type contact layer 28 satisfies $In_y Al_z Ga_{1-y-z}N$ (wherein $0 \leq y$, $0 \leq z$, and y+z<1) and the band gap difference between the p-type contact layer and the p-type intermediate layer is suppressed to a level of 200 meV or below.

Although the dopant concentration in the p-type contact layer 28 in this embodiment is at 1E20 cm$^{-3}$, the invention is not limited thereto. That is, good ohmic contact is possible when doping is made such that the Mg concentration ranges 1E20 cm$^{-3}$ to 1E21 cm$^{-3}$, for which the Mg concentration can be within this range.

Second Embodiment

Figures 5, 6:
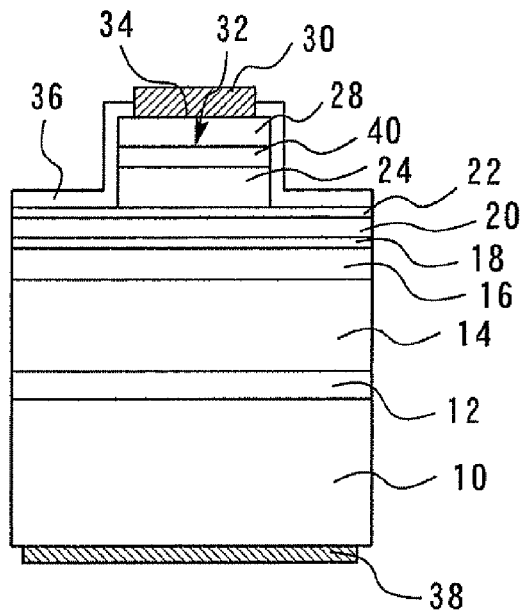
FIG. 5 is a view illustrating an arrangement of a nitride semiconductor light emitting device of second embodiment; and, FIG. 6 is directed to a data arrangement in a table wherein compositions and the like of the p-type clad layers p-type intermediate layer and p-type contact layer of second embodiment are indicated.

This embodiment relates to a nitride semiconductor light emitting device using GaN as a p-type intermediate layer for reducing a working voltage. The nitride semiconductor light emitting device of the embodiment is similar to the nitride semiconductor light emitting device of the first embodiment shown in FIG. 1 except that the composition of the p-type intermediate layer differs therefrom. The composition of the p-type intermediate layer 40 of this embodiment is made up of GaN. The film thickness is at 0.1 μm. In FIG. 6, the composition and the like of the nitride semiconductor light emitting device of this embodiment are tabulated. Composing like that as shown in FIG. 6, the acceptor level of Mg in the p-type intermediate layer can be lowered, so that a high carrier concentration is likely to be obtained. Accordingly, a carrier injection efficiency increases. Eventually, the working voltage can be reduced.

The nitride semiconductor light emitting device of the embodiment increases the carrier injection efficiency, and the band gap differences between the p-type contact layer 28 and the p-type intermediate layer 40 and also between the p-type intermediate layer 40 and the p-type clad layer 24 are, respectively, suppressed to 200 meV or below. In this way, the working voltage reduction, which is an effect illustrated in the first embodiment, becomes possible.

Although the composition of the p-type contact layer 28 is made up of GaN in this embodiment, the invention is not limited to this. More particularly, so far as the composition of the p-type contact layer satisfies $In_yAl_zGa_{1-y-z}N$ (wherein 0≦y, 0≦z and y+z<1) and the band gap difference between the p-type contact layer and the p-type intermediate layer is suppressed to 200 meV or below, the effects of the invention can be obtained.

Although the dopant concentration in the p-type contact layer 28 of this embodiment is 1E20 cm$^{-3}$, the invention is not limited thereto. More particularly, good ohmic contact is possible when doping is made such the Mg concentration ranges from 1E20 cm$^{-3}$ to 1E21 cm$^{-3}$, for which the Mg concentration can be within this range.

According to the invention, a working voltage of the nitride semiconductor light emitting device can be reduced.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-107310, filed on Apr. 16, 2007 including specification, claims, drawings and summary, on which the Convention priority of the present application is based, are incorporated herein by reference in its entirety.

What is claimed is:

1. A nitride semiconductor light emitting device, comprising:
   a p-type contact layer;
   a p-type intermediate layer; and
   a p-type cladding layer, said p-type intermediate layer being located between said p-type contact layer and said p-type cladding layer, wherein band gap energy differences between said p-type contact layer and said p-type intermediate layer and between said p-type intermediate layer and said p-type cladding layer, respectively, do not exceed 100 meV.

2. The nitride semiconductor light-emitting device according to claim 1, wherein:
   said p-type contact layer is Mg-doped $In_yAl_zGa_{1-y-z}N$ (wherein 0≦y, 0≦z, and y+z<1);
   said p-type intermediate layer is Mg-doped $Al_{x1}Ga_{1-x1}N$ (wherein 0≦x1≦1); and
   said p-type cladding layer is Mg-doped $Al_{x2}Ga_{1-x2}N$ (wherein 0≦$x_2$≦1).

3. The nitride semiconductor light-emitting device according to claim 2, wherein:
   said p-type contact layer is GaN; and
   Mg concentration in said p-type contact layer is in a range from $1 \times 10^{20}$ cm$^{-3}$ to $1 \times 10^{21}$ cm$^{-3}$.

4. The nitride semiconductor light-emitting device according to claim 2, wherein Mg concentration in said p-type intermediate layer is in a range from $1 \times 10^{18}$ cm$^{-3}$ to $1 \times 10^{19}$ cm$^{-3}$.

5. The nitride semiconductor light-emitting device according to claim 2, wherein Mg concentration in said p-type intermediate layer is lower than Mg concentrations in said p-type contact layer and in said p-type cladding layer.

6. The nitride semiconductor light-emitting device according to claim 2, wherein said p-type intermediate layer is GaN.

\* \* \* \* \*